United States Patent [19]
Yoon

[11] Patent Number: 5,980,764
[45] Date of Patent: Nov. 9, 1999

[54] GAS INJECTING GADGET FOR SEMICONDUCTOR PRODUCTION FACILITIES AND WAFER-MOUNTING SUSCEPTOR, PRODUCTION METHOD THEREOF AND CHEMICAL COMPOSITION THEREFOR

[76] Inventor: Young Sei Yoon, 115-105, Woosung 7-cha, Apartment ilwon-Dong, Kangnam-Ku, Seoul 135-230, Rep. of Korea

[21] Appl. No.: 08/729,273

[22] Filed: Oct. 10, 1996

[30] Foreign Application Priority Data

Oct. 12, 1995 [KR] Rep. of Korea .................. 95-35138

[51] Int. Cl.⁶ ...................................... B44C 1/22
[52] U.S. Cl. ........................ 216/52; 156/345; 216/88
[58] Field of Search .................. 156/345; 216/52, 216/56, 88, 89

[56] References Cited

U.S. PATENT DOCUMENTS 4,734,152  3/1988  Geis et al. ................... 156/345 X
5,597,495  1/1997  Keil et al. ................... 156/345 X

*Primary Examiner*—William Powell
*Attorney, Agent, or Firm*—Vidas, Arrett & Steinkraus

[57] ABSTRACT

A gas injecting gadget or wafer-mounting susceptor, made of a chemical composition comprising 59.8–69.8% by weight of nickel, 25–35% by weight of copper, a valance weight of aluminum, cobalt, manganese, titanium or the combinations thereof, and E trace amount of inevitable impurities, is produced by a method comprising the steps of: a rough cutting process in which the substance is roughly cut and surface-processed; a precise cutting process in which the roughly processed substance is precisely processed in three stages comprising rough process, finishing process and shaping process; a holing process in which a number of fine holes are formed on the precisely processed substance by a drilling process and chips are removed by a reaming process; an abrasion process in which the substance with holes are abraded by a wet abrading process and a belt polishing process; and a washing and inspecting process. The substance, superior in corrosion and abrasion resistance, along with the method, gives the gas injecting gadget an improved hardness and an extended life.

4 Claims, 3 Drawing Sheets

GAS INJECTING GADGET FOR SEMICONDUCTOR PRODUCTION FACILITIES AND WAFER-MOUNTING SUSCEPTOR, PRODUCTION METHOD THEREOF AND CHEMICAL COMPOSITION THEREFOR

BACKGROUND OF THE INVENTION

1. Field of the Invention

The present invention relates to gas injecting gadgets for producing DRAM semiconductor devices and to a chemical composition therefor. More particularly, the present invention relates to gas injecting gadgets for semiconductor production facilities, endurable to the inferior conditions within the facilities, such as high frequency in high electric field and noxious gas, whereby the production yield of semiconductor memory devices can be improved, and to a chemical composition therefor. Also, the present invention is concerned with a method for producing the gadgets.

2. Description of the Prior Art

To produce a semiconductor device, various techniques and processes have been developed and are now usefully applied. For operating such processes, several or many apparatuses or equipments are necessary. For example, a wafer etching process for DRAM semiconductor device requires essential gas injecting gadgets, such as a cathode, a gas distribution plate (GDP) and a uni-lid GDP. Besides, in manufacturing a DRAM semiconductor device, a shower head, a kind of a gas injecting gadget, is used for a chemical vapor deposition process and a wafer-mounting susceptor is also employed.

The above-illustrated apparatuses play pivotal roles in fabricating the memory DRAM and in determining its data. Until recent, they have been made mainly of aluminum. A typically used aluminum is 6061-T6, which shows a tensile strength of 30 kg/mm$^2$, an yield strength of 25 kg/mm$^2$, a draw ratio of 10%, a melting point of 582–652° C. and a hardness of 25–40 Hv. Besides such aluminum, other metals, such as iron, silica, copper, manganese, magnesium, chrome and titanium, are added at trace amounts for manufacturing a gas injecting gadget useful for semiconductor production facilities and a susceptor to be amounted on a wafer.

These conventional gas infecting gadget and susceptor, which are made mainly of such aluminum as has the above physical properties, however, has a significant disadvantage of being susceptible to the high frequency resulting from the strong electric field present in semiconductor production facilities and to noxious gas such as chlorine ($Cl_2$), hydrogen bromide (HBr) and trifluoronitrogen ($NF_3$). A certain time after the gadget and the susceptor work in the production facilities, they become to corrode or show deteriorated mechanical properties, being unable to exhibit perfect functions.

Conventionally, to solve this problem, an aluminum material is subjected to precise surface processing and the refined surface is coated with an oxide film, thereby conferring durability to the aluminum for a certain period. That is, the aluminum is reacted with oxygen by carrying out electrolysis in a 7–10% sulfuric acid solution, to form a strong oxide film consisting of $Al_2O_3$ at the aluminum's surface. The oxide film serves to protect the aluminum, constituting the gas injecting gadget and the susceptor, from the bad conditions in the semiconductor production facilities, so as to improve the durability of the gadget and the susceptor. During the oxidation reaction, the number of the aluminum oxide coating increases exponentially. After completion of the reaction, there are a large number of pores in the coating and a barrier layer 2–3 $\mu$m thick at the aluminum surface. Indeed, it is the barrier layer which protects the aluminum surface. This protecting layer may be reinforced by sealing the pores, that is, filling the pores with nickel salts or other corrosion-resistant or abrasion-resistant materials.

Such aluminum-based materials are molded and processed into the gas injecting gadgets which are durable to the extremely severe conditions within semiconductor production facilities, conventionally by the following method.

First, for example, 6061 aluminum raw material is subjected to an annealing process, then, to a rough cutting process and finally, a precise cutting process, to give a basic shape of the desired gas injecting gadget. Subsequently, a Jet, the core part of the gas injecting gadget, is formed. For this, more than 1,000 holes with a diameter of 1 mm are formed on the aluminum by using a drill after which the aluminum is abraded with a non-ionic material to remove the impurities present on the surface of the aluminum material. The aluminum material thus ready is provided with an oxide coating at its surface by the oxidative reaction which results from the electrolysis of a sulfuric acid solution. After the pores occurring the coating are sealed with nickel salt and the like, a precise cutting process is carried out again, to produce a whole gas injecting be gadget.

To produce a gas injecting gadget with such conventional materials in the above-mentioned method is easy. However, the gas injecting gadget obtained is inferior in corrosion resistance to such gas as fluorine ($F_2$) or chlorine ($Cl_2$) as well as in durability to such physical condition as high frequency. Since the surface states of the gas injecting gadget, for instance, hardness, gloss, crack, chromaticity and roughness, are greatly affected by the conditions upon the surface treatment for forming the oxide coating, such as current, voltage, density, composition of chemical solution and temperature, the conditions should be maintained properly. After the surface treatment, the gas injecting gadget is available only for a short time, for instance, 30–90 hours when being mounted in semiconductor production facilities. Especially, hazardous gas penetrates into the barrier layer of the oxide coating and finally damages the whole coating. As a result, the oxide coating breaks down into pieces which, then, fall down on a wafer, resulting in a significant decrease in wafer quality. In addition, as the chemical reactions produced by the reaction between the gas within the facilities and the coating accumulate inside several thousands fine gas injecting holes, each with a diameter of 1 mm, they are considerably reduced in diameter, lowering the amount of gas injected. Thus, there is difficulty in data control that the gas amount to be introduced into the gas injecting gadget should be controlled again in order to constantly maintain the gas amount to be injected upon a wafer.

SUMMARY OF THE INVENTION

It is an objective of the present invention to overcome the above problems encountered in prior arts and to provide a composition from which a gas injecting gadget or susceptor with such corrosion- and abrasion resistance as to confer distinguished durability even to the inferior conditions of semiconductor production facilities, is produced.

It is another objective of the present invention to provide the gas injecting gadget or susceptor It is a further objective of the present invention to provide a method for producing the gas injecting gadget or susceptor.

In accordance with an aspect of the present invention, there is provided a composition comprising 59.8–69.8% by weight of nickel, 25–35% by weight of copper, a valance weight of aluminum, cobalt, manganese, titanium or the combinations thereof, and a trace amount of inevitable impurities, which is used as a substance for gadgets for etching process facilities or chemical vapor deposition process facilities or for wafer-mounting suseceptors.

In accordance with another aspect of the present invention, there is provided a method for processing a gas injecting gadget or a wafer-mounting susceptor, using as a substance a chemical composition comprising 59.8–69.8% by weight of nickel, 25–35% by weight of copper, a valance weight of aluminum, cobalt, manganese, titanium or the combinations thereof, and a trace amount of inevitable impurities and comprising the steps of, a rough cutting process in which the substance is roughly cut and surface-processed; a precise cutting process in which the roughly processed substance is precisely processed in three stages comprising rough process, finishing process and shaping process; a holing process in which a number of fine holes are formed on the precisely processed substance by a drilling process and chips are removed by a reaming process; an abrasion process in which the substance with holes are abraded by a wet abrading process and a belt polishing process; and a washing and inspecting process.

Compared with conventional ones, the gas injecting gadgets produced from the chemical composition by the method of the present invention has an extended life span by 30–50%. The hardness of the gas injecting gadgets of the present invention is on the order of 300 Hv or more, which is 10-fold higher than that of conventional ones.

In contrast to conventional ones, the gadgets of the present invention need not the surface-treating process for oxide coating by virtue of superior corrosion resistance and abrasion resistance of the substance itself, which partially contributes to reducing the entire procedure of the present invention into about 70% of conventional entire procedure. In addition, the absence of the oxide coating has few particles fallen down on a wafer and brings about at least 6-folds improvement in surface roughness and at least 5-folds in surface gloss as well as removes the fear of crack.

BRIEF DESCRIPTION OF THE DRAWINGS

The above and other objects and aspects of the invention will become apparent from the following description of embodiments with reference to the accompanying drawings in which.

DETAILED DESCRIPTION OF THE INVENTION

Figure 1:
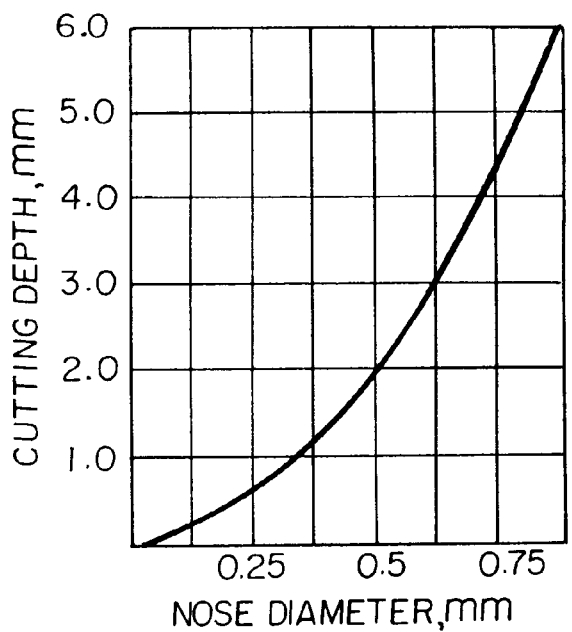
FIG. 1 is a graph showing cutting depth with respect to nose diameter.
Figure 2:
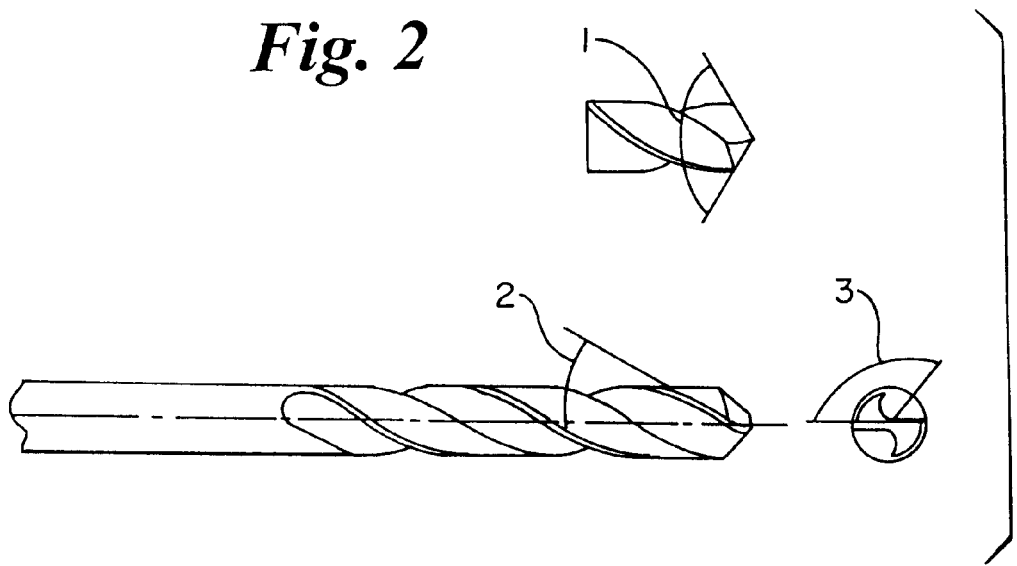
FIG. 2 is a view showing a drill used for hole processing.

In contrast to the prior arts which use aluminum-based material with a coating of oxide as a substance for a gas injecting gadget, such as cathode, GDP, uni-lid GDP and shower head, the present invention is based on an alloy comprising nickel and copper. Nickel is very good in corrosion resistance and thermal resistance but poor in abrasion resistance which is essential to endure the strong electric force, such as high frequency, in semiconductor production facilities. This weak point can be complemented by combining nickel with copper at a proper ratio. Copper, a representative metal of low elongation like iron, is of high abrasion resistance as well as shows superior machinability, Copper, however, has a significant disadvantage of being easily corroded by chlorine gas as indicated by the following reaction formula:

$$Cu + Cl_2 \rightarrow CuCl_2$$

Therefore, nickel and copper should be mixed at a proper ratio, to achieve the desired objectives of the present invention. In accordance with the present invention, a composition for gas injecting gadget comprises 59.8–69.8% by weight of nickel and 25–35% by weight of copper. In such composition range, the ductility of nickel and the machinability of copper are optimized. The resulting gas injecting gadget is found to be superior in both corrosion resistance and abrasion resistance.

To make an alloy having Such a composition, it is required to melt nickel and copper, These two metals start to melt generally at 1,250 to 1,300° C. and exhibit the most proper melting state at 1,500 to 1,800° C. In this state, a trace amount of compatabilizing metals including aluminum, cobalt, manganese, silica and/or titanium, is added to increase the bonding force between the nickel and the copper and to prevent the release from each other.

Thereafter, the composition thus obtained is subjected to molding process to give a desired gas injecting gadget which is then quenched. A desirable chemical composition used as a substance for gas injecting gadget is exemplified in Table 1 below.

TABLE 1

| Comp. | Ni | Cu | Al | C | Co | Fe | Mn | S | Si | Ti |
|---|---|---|---|---|---|---|---|---|---|---|
| Wt % | 64.8 | 30.0 | 2.29 | .13 | .01 | .75 | .63 | .001 | .10 | .64 |

The mechanical properties of the above chemical composition are as follows: guaranteed stress 660–670 N/mm$^2$; elastic force 1,000–1,010 N/mm$^2$; tensile strength 25–30 kg/mm$^2$; hardness 300–32- Hv; impact value 90–95; density 8–9 g/ml; melting temperature 1,310–1,370° C.; elastic modulus 24–28; and Poisson's ratio 0.30–0.35.

In addition to showing such mechanical properties, the alloy composition of the present invention obtains such high durability and abrasion resistance that it persists under the noxious gas and the electrical force in semiconductor production facilities for a long time.

With regard to the processing and molding of the alloy composition into a gas injecting gadget, such as cathode, GDP, uni-lid GDP or shower head, there will be given a description below.

First, there is a rough-cutting process. In this process, a preliminary molding work for layouting a desirable shape is carried out by cutting the substance and surface-processing the cut substance. Because the substance has a hardness of at least about 320 Hv, the tools to be used for cutting and surface-processing the substance, should be of higher hardness. Mostly, cutters made of diamond are employed.

When the substance is cut with a diamond wheel, much heat occurs at the cut portion owing to the strong hardness of the substance. The heat is then transferred all over the substance, leading to distorting the substance and changing in its inherent properties, In order to prevent the problem of heat transfer, the environmental temperature of the substance is kept low upon cutting the substance, in the rough-cutting process of the present invention. For the same purpose, the cutting speed of the substance is necessary to be under control. For example, it starts at 18–33 m/min and is linearly reduced to 7–15 m/min after 100 min. In addition, the surface process is also carried out at a low temperature of 0 to –5° C. with non-ionic oil added, to prevent the heat transfer and corrosion.

A second step of the method of the present invention is a precise cutting process in which the substance preliminarily processed in the rough cutting process is precisely processed into a desired dimension.

In this step, temperature control and processing conditions are important factors which determine the quality of the final article. As in the rough cutting process, the substance must be kept at a temperature of 0 to –5° C. while the working facilities are at about 10° C., so as to prevent the heat occurring upon cutting from being transferred all over the substance. For this, a freezer is assigned around the substance and the facilities and low temperature air is pumped inside the facilities. Non-ionic oil is also used to improve is the machinability of the substance and to prevent the substance from being corroded. The conditions which affect the precise cutting process include shape and substance of cutting edge, cutting oil, chip control and surface cutting speed. The desirable effect of the precise cutting process is dependent of how such process conditions are controlled, According to the shape of a cutting edge which is used to cut the roughly processed substance into a desirable dimension, the size of the chip produced upon cutting is determined. Also, the cutting width and the cutting depth at which the substance is cut horizontally and perpendicularly respectively upon one stroke of a cutter, are dependent of the shape of the cutting edge. However, the shape of the cutting edge is determined by the depth of the cutter and the diameter of nose. In FIG. 1, the cutting depth is plotted with respect to the nose diameter. As seen in the plot, the cutting depth increases exponentially as the nose diameter of the cutting edge increases. Thus, the considerations in determining the shape of cutting edge should include the cutting depth and the feed optimally required in the precise cutting process. The high hardness of the substance requires that the cutting edge be of higher hardness. In most cases, high speed steel is used to make the cutting edge.

Sulfur oil is used as a cutting oil to improve the machinability of the substance and to prevent the substance from being corroded.

Controlling the chip generated upon cutting the substance by the cutting edge brings about a significant improvement in machinability and in surface flatness of the substance as well as elongates the life time of the cutting tool. For example, when a horizontal cutting speed is 0.325 mm/min, setting the depth and the width of a chip discharging site to 0.624 mm and 3.12 mm respectively allows the chip to be smoothly controlled.

In consideration of the above-mentioned process conditions, the precise cutting process of the present invention is carried out in three stages to maximize the process effect; in a rough process stage, a cutting depth of 10–16 mm, a feed of 1.00–1.30 mm and a transfer speed on table surface of 6–15 m/min; in a finishing process stage, a cutting depth of 0.2–0.3 mm, a feed of 6.10–6.55 and a transfer speed on table surface of 6–15 m/min; and a shaping process stage, a feed of 0.127–0.254 mm and a transfer speed on table surface of 6–15 mm.

The purpose of performing the cutting of a substance for a gas injecting gadget, such as cathode, GDP, uni-lid GDP or shower head, in two steps, the rough cutting process and the precise cutting process, the latter consisting of three stages, is to prevent property change and distortion of the substance owing to much heat generated upon cutting because the substance is rigid with a hardness of at least 300 Hv and to more precisely cut the substance.

Next to the precise cutting step, a hole processing step comes in which more than 1,000 fine holes each with a diameter of 1 mm or less are formed to endow a gas injecting function to the substance that has passed through the precise cutting step. Taking gas injection properties into account, the shape of a drill used in the hole processing step, drilling conditions and reaming process are important factors to determine the data and performance of the final article. In accordance with the present invention, a drill which has a point angle (1) of 115–120°, a helix angle (2) of 28–31°, and an angle of edge ranging from 125–135°, is used. Drilling is executed in such a manner that a depth of 0.0127–0.025 mm is cut while the drill revolves one round, that is, a hole processing speed is on the order of 0.0127–0.025 mm/rev, with a transfer speed on surface ranging from 17–23 m/min. A reaming process in which chips are removed uses a keen and planar cutting edge moving at a cutting speed of 0.0482–0.121 mm/min. When 3,519 holes each with a diameter of 0.75 mm are formed on a substance with a diameter of 200 mm using the above hole process, an allowable error must be within $5/1000$ of the substance diameter, with the tolerance of each hole lower than $5/1000$ of the hole diameter.

A forth step is an abrasive finishing step in which the surface of the substance with several thousands of holes is polished to improve the surface roughness of the substance, to remove impurities therefrom and to give the substance a gloss similar to that of mirror surface, thereby producing a gas injecting gadget directly applicable for semiconductor production facilities. In this step, the chemical composition of an abrasive used and the abrading speed of a grinder used are selected as important technical factors to achieve a desired effect. This step is divided into two stages, a wet abrading process and a belt polishing process. In the wet abrading process, 0.65 kg of sodium carbonate is dissolved in 100 liter of water and non-ionic neutral surfactants are added at an amount of a half of the water, to give a solution. Using the solution as an abrasive, the surface of the substance is abraded at a speed of 800–1,200 rpm. Subsequently, the belt polishing process is carried out using woolen cloth No. 220.

Figure 3:
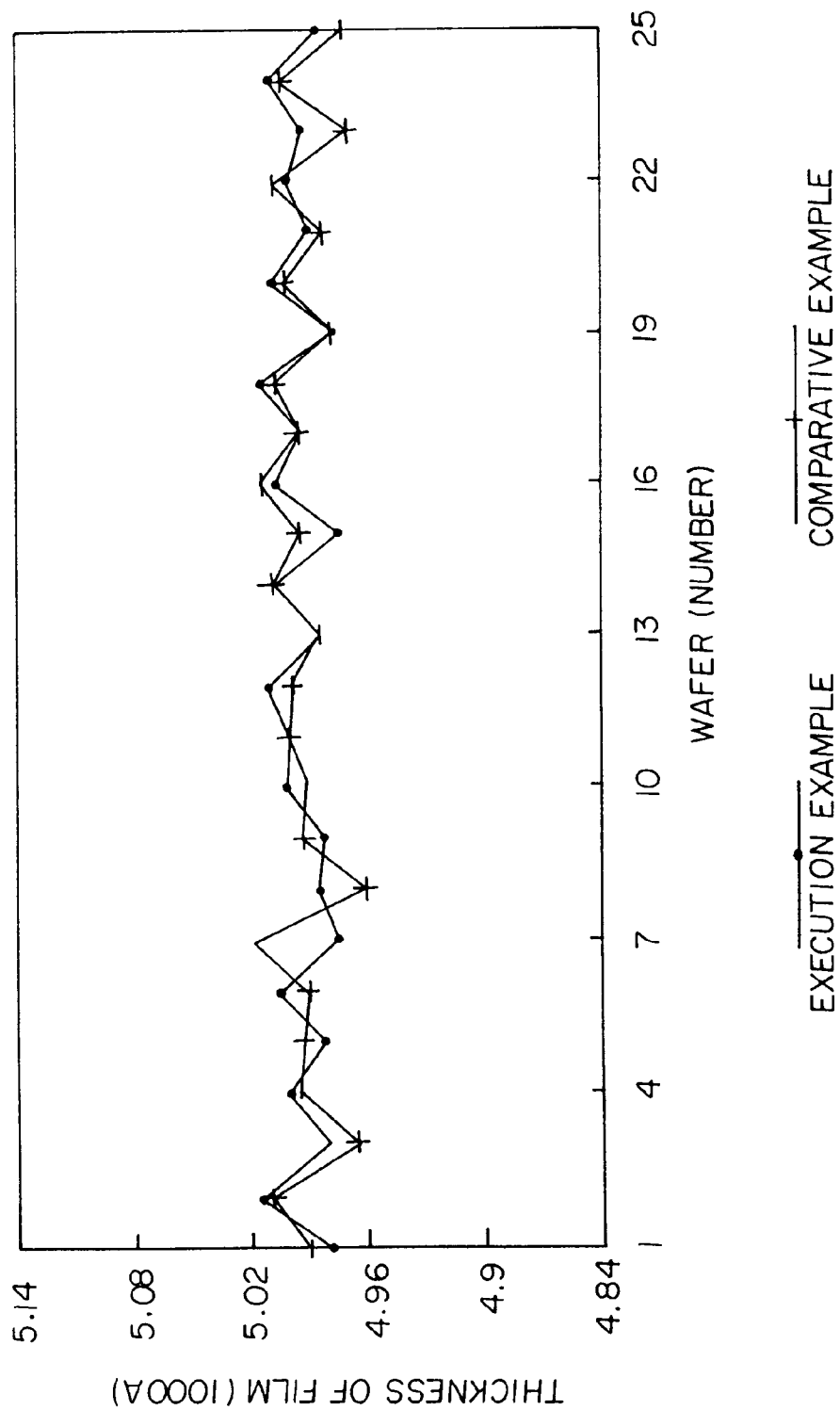
FIG. 3 shows the thicknesses of the films formed on wafers.
Figure 4:
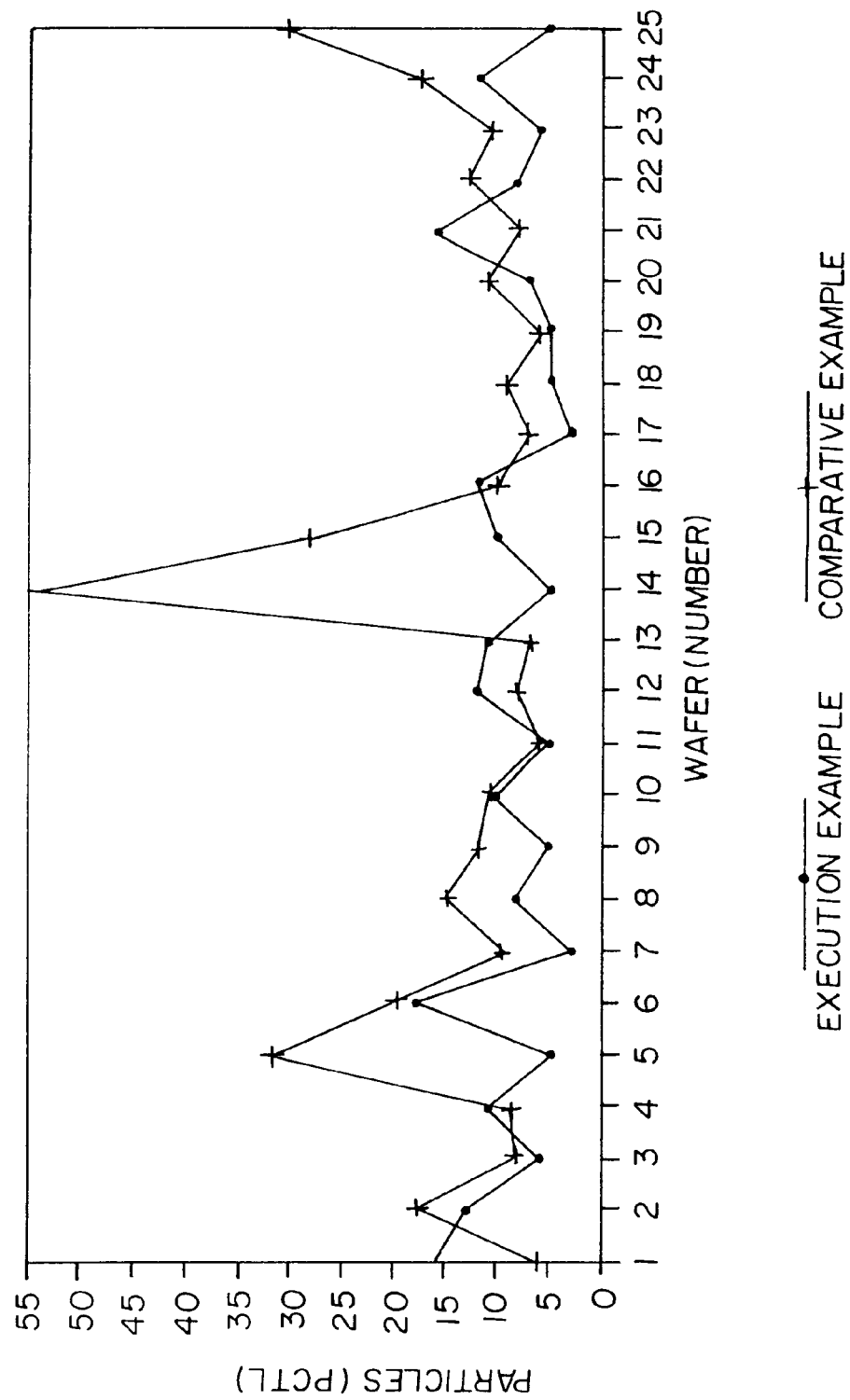
FIG. 4 shows the number of the particles fallen down on wafers.

A fifth step is a washing step in which the gas infecting gadget obtained through the preceding steps is washed in a jet spray washing machine using isopropyl alcohol or an ultrasonic washing machine. Thereafter, the holes each are inspected by a microscope with a magnitude of 500 times, The gas injecting gadgets, such as cathode, GDP, uni-lid GDP and shower head, made of the composition of the present invention endurable to the inferior condition of semiconductor production facilities, and conventional ones were applied to etching process and CVD process facilities and the results obtained by using them were compared with each other as illustrated in FIGS. 3 and 4. As shown in FIG. 3, the films formed on wafers are more uniform in thickness when using the gas injecting gadget of the present invention than when using conventional ones. In particular, the thicknesses of the films obtained according to the present invention are distributed within an error range of 2% of film thickness. FIG. 4 shows the comparison of the fine impurity particles present on wafers between the present invention and a conventional technique. As apparent from the graph, fewer numbers of impurity particle are present on a wafer when using the gas injecting gadget of the present invention than when using a conventional one. This is attributed to the fact that, since the gas injecting gadget of the present invention can be directly used without treatment with an oxide coating by virtue of the superior corrosion and abrasion resistance of the substance, few particles fall down from the gas injecting gadget while an oxide coating essential to the conventional gas injecting gadget is broken down into particles which then fall down on wafers, deteriorating the quality of the final product.

Of course, the substance consisting of the alloy composition of the present invention, endurable to the inferior condition of semiconductor production facilities can be applicable for the susceptor to be mounted on a wafer.

As described hereinbefore, the substance made of the composition of the present invention, superior in corrosion and abrasion resistance, along with the method for processing the composition, gives gas injecting gadgets, such as cathode, GDP, uni-lid GDP and shower head, an improved hardness and an extended life. Also, by virtue of the superior corrosion resistance and abrasion resistance of the substance itself, the entire procedure of the molding process can be reduced, which resulting in an improvement in productivity. In addition, since the wafer according to the present invention has few particles on its surface, it shows more improved quality. In result, the production yield of memory DRAM can be enhanced by 5% or more.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. An alloy composition used as a base substance for gadgets in etching process facilities or chemical vapor deposition process facilities for producing semiconductor devices, comprising:

59.8–69.8% by weight of nickel and 25–35% by weight of copper as main components; and being balanced by at least one selected from the group consisting of aluminum, cobalt, manganese, silica titanium and the combinations thereof to enhance the bonding force between said main components.

2. A gas injecting gadget which is formed using the alloy composition of claim 1 as a base substance.

3. The gas injecting gadget according to claim 2, wherein said gas injecting gadget is a cathode, a gas distribution plate, a uni-lid gas distribution plate or a shower head.

4. A method for manufacturing a gas injecting gadget, providing the alloy composition of claim 1 as a base substance and subsequently processing and molding the composition into said gas injecting gadget.

* * * * *